US008164873B2

(12) United States Patent
Haible et al.

(10) Patent No.: US 8,164,873 B2
(45) Date of Patent: Apr. 24, 2012

(54) INTEGRATOR AND CIRCUIT-BREAKER HAVING AN INTEGRATOR

(75) Inventors: Jürgen Haible, Nürnberg (DE); Manfred Schiller, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 91 days.

(21) Appl. No.: 12/839,806

(22) Filed: Jul. 20, 2010

(65) Prior Publication Data

US 2011/0026180 A1  Feb. 3, 2011

(30) Foreign Application Priority Data

Jul. 30, 2009  (DE) .......................... 10 2009 036 003

(51) Int. Cl.
*H02H 3/08* (2006.01)
(52) U.S. Cl. ....................................... 361/93.1
(58) Field of Classification Search .................. 361/93.1
See application file for complete search history.

(56) References Cited

U.S. PATENT DOCUMENTS

| 3,513,404 | A | * | 5/1970 | Howe et al. ........................ 330/9 |
| 3,546,532 | A | * | 12/1970 | Eisenstadt ........................ 361/21 |
| 4,387,438 | A | * | 6/1983 | Lucich et al. ................. 702/195 |
| 5,523,760 | A | * | 6/1996 | McEwan ........................ 342/89 |
| 6,680,642 | B2 | * | 1/2004 | Edell et al. ..................... 327/538 |
| 7,309,993 | B2 | | 12/2007 | Driehorn et al. |
| 7,756,279 | B2 | * | 7/2010 | Deruginsky et al. ............ 381/95 |
| 2005/0116773 | A1 | * | 6/2005 | Laletin ............................ 330/69 |
| 2007/0182401 | A1 | | 8/2007 | Driehorn et al. |
| 2009/0145226 | A1 | * | 6/2009 | Cai ............................. 73/514.09 |
| 2011/0048547 | A1 | * | 3/2011 | Hasson et al. ................ 137/341 |
| 2011/0267212 | A1 | * | 11/2011 | Denison ........................ 341/122 |

FOREIGN PATENT DOCUMENTS

DE  1 931 502  12/1970
DE  10 2004 011 023 A1  9/2005

OTHER PUBLICATIONS

Tietze,U.; Schenk,CH.: Halbleiter-Schaltungstechnik, Springer-Verlag Berlin, et al, 10. Edition., 1993, p. 855, Fig. 25.4 ISBN 3-540-56184-6; Book; 1993; DE.

* cited by examiner

*Primary Examiner* — Ronald W Leja
(74) *Attorney, Agent, or Firm* — Harness, Dickey & Pierce, P.L.C.

(57) ABSTRACT

An integrator and a circuit-breaker are disclosed, the integrator being in the form of a passive symmetrical low-pass filter having an integration capacitor. In order to make it possible to temporally integrate an electrical signal in an improved manner, it is proposed in at least one embodiment that provision be made of a differential amplifier having two amplifying elements each having an input, that the two amplifying elements be coupled to one another in order to generate a differential signal, that the inputs of the two amplifying elements be connected to one another via the integration capacitor, and that each amplifying element be positively fed back to its input via a feedback loop in such a manner that the two amplifying elements together form a negative input resistance in parallel with the integration capacitor.

5 Claims, 1 Drawing Sheet

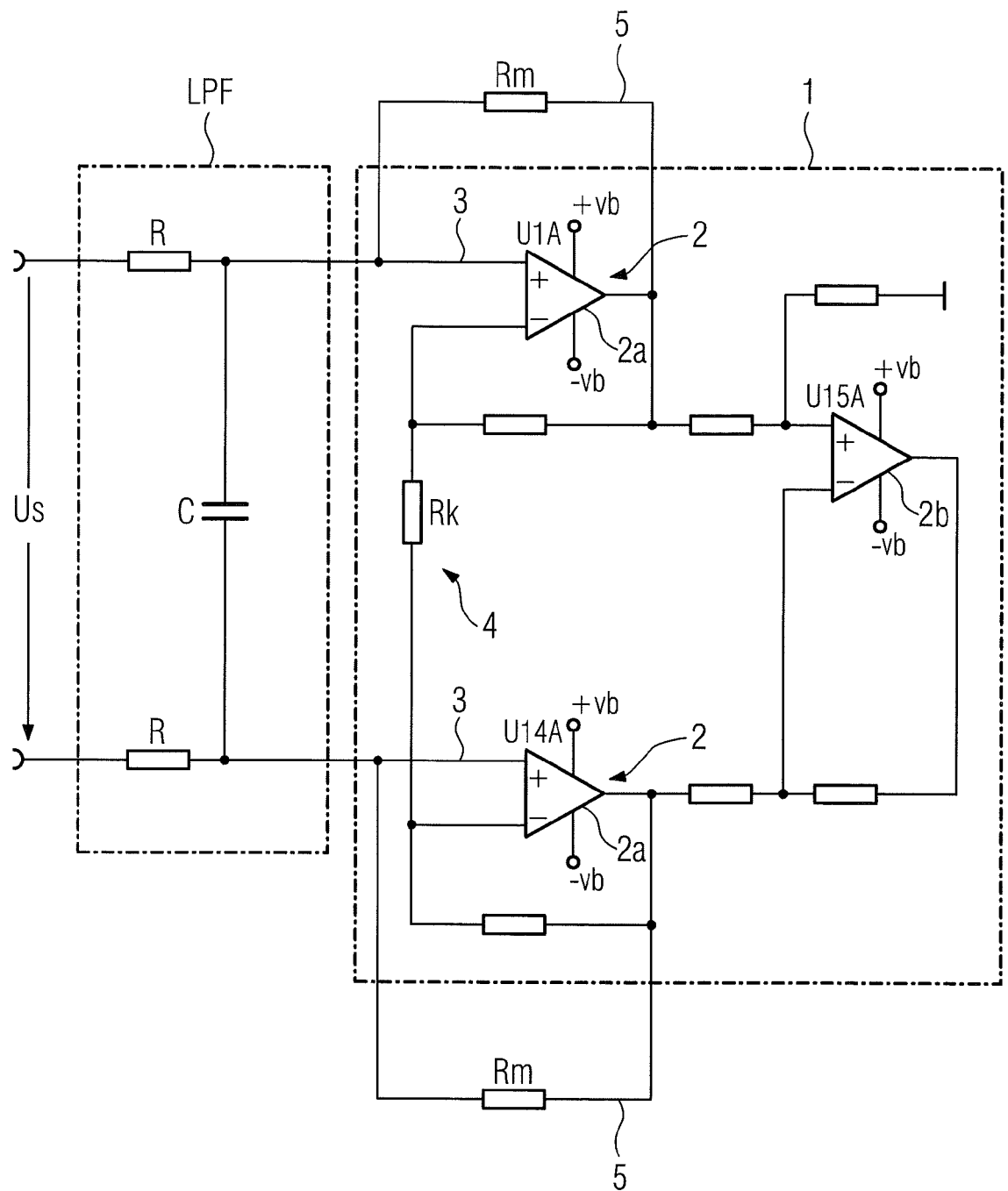

INTEGRATOR AND CIRCUIT-BREAKER HAVING AN INTEGRATOR

PRIORITY STATEMENT

The present application hereby claims priority under 35 U.S.C. §119 on German patent application number DE 10 2009 036 003.4 filed Jul. 30, 2009 the entire contents of which are hereby incorporated herein by reference.

FIELD

At least one embodiment of the invention generally relates to an integrator and/or to a circuit-breaker.

BACKGROUND

In order to integrate electrical signals, it is known practice to use an analog passive low-pass filter which, in the simplest case, consists of a resistor/capacitor combination (RC element). Such integrators are used, for example, in electronic circuit-breakers in order to determine the currents flowing through the circuit-breaker since current transformers with Rogowski coils, which generate a voltage that is proportional to the temporal derivative of the current, are usually used as current sensors. An analog passive low-pass filter has the advantage that it largely suppresses (short-circuits) radio-frequency interference, which simplifies subsequent signal processing, in particular. In this case, the integration capacitor with a relatively large capacitance is directly connected, for example, to the two inputs (input pins) of the subsequent integrated circuit (for example an operational amplifier). The disadvantage of such a low-pass filter is that the phase response deviates greatly from that of an ideal integrator, to be precise also when the base frequency of the low-pass filter is considerably below the frequency range of interest, as a result of which the amplitude response has only a relatively small error.

In contrast, the phase error is large and can also be corrected only with difficulty by means of digital signal processing on account of its non-linearity. However, in principle, the phase error can be eliminated by means of active integration, for example by connecting the capacitor to the negative feedback path (the feedback loop) of an operational amplifier in a simple design, which results, in practice, in an ideal amplitude and phase response in the frequency range of interest. However, if a single-ended input (all signals are related to ground) is used, one side of the capacitor is still at the input signal, but the other side is not at ground, where it cannot discharge any radio-frequency interference either, but at the output of the operational amplifier. In this manner, radio-frequency interference can pass into the operational amplifier, which can result in unmanageable errors. This problem also exists with a symmetrical (differential) input circuit in which the solution is to short-circuit the radio-frequency interference by way of a capacitor between the two inputs (input pins).

SUMMARY

At least one embodiment of the invention is directed to an integrator and a circuit-breaker having such an integrator, which makes it possible to temporally integrate an electrical signal in an improved manner.

In terms of the integrator, the solution provides for provision to be made of a differential amplifier having two amplifying elements each having an input, for the two amplifying elements to be coupled to one another in order to generate a differential signal, for the inputs of the two amplifying elements to be connected to one another via the integration capacitor, and for each amplifying element to be positively fed back to its input via a feedback loop in such a manner that the two amplifying elements together form a negative input resistance in parallel with the integration capacitor. A symmetrical differential amplifier of the instrumentation amplifier type is thus proposed, which amplifier generates a negative input resistance which greatly reduces the deviation of the phase response from the ideal integrator and thus greatly reduces the integration error without having to dispense with the suppression of radio-frequency interference. The two amplifying elements are connected to one another via an electrical coupling element, in particular an electrical resistor.

In terms of the circuit-breaker, at least one embodiment provides for the integrator to have a differential amplifier having two amplifying elements each having an input, for the two amplifying elements to be coupled to one another in order to generate a differential signal, for the inputs of the two amplifying elements to be connected to one another via the integration capacitor, and for each amplifying element to be positively fed back to its input via a feedback loop in such a manner that the two amplifying elements together generate a negative input resistance in parallel with the integration capacitor. The integrator used is virtually resistant to radio frequency and therefore has correspondingly better interference immunity. Spurious tripping can be reduced in this manner with little complexity.

BRIEF DESCRIPTION OF THE DRAWINGS

The invention is described in more detail below using an example embodiment and the drawing wherein:

The single FIGURE shows an integrator for a low-voltage circuit-breaker (not illustrated in any more detail) having at least one switching contact which is opened and closed by a drive apparatus

DETAILED DESCRIPTION OF THE EXAMPLE EMBODIMENTS

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another.

For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

The single FIGURE shows an integrator for a low-voltage circuit-breaker (not illustrated in any more detail) having at least one switching contact which is opened and closed by a drive apparatus. The opening and closing of the switching contact is triggered by an electronic overcurrent release on the basis of the current flowing through the switching contact. The current is detected using a current sensor which is in the form of a current transformer and has a Rogowski coil. The Rogowski coil uses the flowing current to generate a voltage which corresponds to the temporal derivative of the current. The flowing current is determined therefrom using an active analog integrator.

The integrator is in the form of a passive symmetrical low-pass filter LPF which has an instrumentation amplifier 1 connected downstream of it. The instrumentation amplifier 1 is a differential amplifier having two amplifying elements 2 which are two operational amplifiers 2a in this case. The two operational amplifiers 2a each have an input 3 and are connected to one another, on the input side, in order to generate the differential signal in the form of a differential voltage, via an electrical resistor Rk as an electrical coupling element 4.

The voltage Us corresponding to the temporal derivative of the current is applied to the inputs 3 of the two operational amplifiers 2a via resistors R. The two inputs are connected to one another via an integration capacitor C; the integration capacitor C and the resistors R form a symmetrical low-pass filter LPF (passive RC filter). Resistors Rm which are dimensioned such that positive feedback is produced in such a manner that a negative input resistance is established in parallel with the integration capacitor C are connected in the negative feedback path 5. The output voltages from the two operational amplifiers 2a are amplified by a third operational amplifier 2b.

If the desire is to completely compensate for the resistance R of the low-pass filter LPF with the aid of a negative resistance, in particular in order to obtain an ideal integrator, a move is made to the stability limit of the instrumentation amplifier 1. In practice, a safety margin must therefore always be complied with, with the result that the process always takes place in the stable range of the amplifier 1, taking into account component tolerances, aging, temperature response etc. However, the integrator then no longer behaves like an ideal integrator but rather the phase response of such a "partially compensated" low-pass filter LPF deviates only slightly from the phase response of an ideal integrator.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combineable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. An integrator, in the form of a passive symmetrical low-pass filter including an integration capacitor, the integrator comprising:
 a differential amplifier including two amplifying elements, each including an input, the two amplifying elements being coupled to one another in order to generate a differential signal, wherein the inputs of the two amplifying elements are connected to one another via the integration capacitor and wherein each of the two amplifying elements is positively fed back to its input via a feedback loop in such a manner that the two amplifying elements together form a negative input resistance in parallel with the integration capacitor.

2. A circuit-breaker, comprising:
 at least one switching contact;
 a drive apparatus which opens and closes the at least one switching contact;
 a current sensor to detect a sensor signal which corresponds to a temporal derivative of current respectively flowing via the at least one switching contact;
 an active analog integrator for determining the current by integrating the sensor signal, the active analog integrator being in the form of a passive symmetrical low-pass filter including an integration capacitor;
 an electronic overcurrent release to open the at least one switching contact on the basis of the current determined, wherein the active analog integrator includes a differential amplifier including two amplifying elements, each of the two amplifying elements including an input, wherein the two amplifying elements are coupled to one another in order to generate a differential signal, wherein the inputs of the two amplifying elements are connected to one another via the integration capacitor, and wherein each of the two amplifying elements is positively fed back to its input via a feedback loop in such a manner that the two amplifying elements together generate a negative input resistance in parallel with the integration capacitor.

3. A circuit-breaker comprising the integrator of claim 1.

4. The circuit-breaker of claim 3, wherein the circuit-breaker is for low voltages.

5. The circuit-breaker of claim 2, wherein the circuit-breaker is for low voltages.

* * * * *